US012568586B2

(12) United States Patent
Huang et al.

(10) Patent No.: US 12,568,586 B2
(45) Date of Patent: Mar. 3, 2026

(54) INDUCTOR ASSEMBLY AND MANUFACTURING METHOD FOR INDUCTOR ASSEMBLY

(71) Applicant: SHENNAN CIRCUITS CO., LTD., Shenzhen (CN)

(72) Inventors: Lixiang Huang, Shenzhen (CN); Zedong Wang, Shenzhen (CN); Hua Miao, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 632 days.

(21) Appl. No.: 18/150,777

(22) Filed: Jan. 5, 2023

(65) Prior Publication Data

US 2023/0154665 A1 May 18, 2023

Related U.S. Application Data

(63) Continuation of application No. PCT/CN2020/127010, filed on Nov. 6, 2020.

(30) Foreign Application Priority Data

Jul. 7, 2020 (CN) .......................... 202010645958.1

(51) Int. Cl.
H01F 5/00 (2006.01)
H01F 27/06 (2006.01)
(Continued)

(52) U.S. Cl.
CPC ............. H05K 3/143 (2013.01); H01F 27/06 (2013.01); H01F 27/24 (2013.01); H01F 27/324 (2013.01);
(Continued)

(58) Field of Classification Search
CPC ....................................................... H01F 27/24
(Continued)

(56) References Cited

U.S. PATENT DOCUMENTS 3,319,207 A * 5/1967 Davis .................... H01F 17/062
336/200
2005/0052268 A1 * 3/2005 Pleskach ............. H01F 17/0033
336/200
(Continued)

FOREIGN PATENT DOCUMENTS

CN 101772264 A 7/2010
CN 101795539 A 8/2010
(Continued)

OTHER PUBLICATIONS

International Search Report and Written Opinion, application No. PCT/CN2020/127010, mailed on Mar. 26, 2021.
(Continued)

*Primary Examiner* — Ronald Hinson

(57) ABSTRACT

An inductor assembly and a manufacturing method for an inductor assembly are provided. The inductor assembly includes a circuit board, a magnetic component, and a winding wire. The circuit board defines a groove body, the magnetic component is embedded in the groove body, and the winding wire is arranged on the magnetic component, surrounds along a thickness direction of the magnetic component, and is electrically connected to the circuit board.

15 Claims, 4 Drawing Sheets

(51) Int. Cl.

| | | |
|---|---|---|
| *H01F 27/24* | (2006.01) | |
| *H01F 27/32* | (2006.01) | |
| *H01F 41/12* | (2006.01) | |
| *H05K 1/02* | (2006.01) | |
| *H05K 1/11* | (2006.01) | |
| *H05K 1/183* | (2026.01) | |
| *H05K 1/185* | (2026.01) | |
| *H05K 3/06* | (2006.01) | |
| *H05K 3/14* | (2006.01) | |
| *H05K 3/16* | (2006.01) | |
| *H05K 3/18* | (2006.01) | |
| *H05K 3/40* | (2006.01) | |

(52) U.S. Cl.
CPC ......... *H01F 41/127* (2013.01); *H05K 1/0298* (2013.01); *H05K 1/111* (2013.01); *H05K 1/115* (2013.01); *H05K 1/183* (2013.01); *H05K 1/185* (2013.01); *H05K 3/061* (2013.01); *H05K 3/146* (2013.01); *H05K 3/16* (2013.01); *H05K 3/188* (2013.01); *H05K 3/4038* (2013.01); *H01F 2027/065* (2013.01); *H05K 2201/0183* (2013.01)

(58) Field of Classification Search
USPC ........................................ 336/200, 221, 229
See application file for complete search history.

(56) References Cited

U.S. PATENT DOCUMENTS

| | | | |
|---|---|---|---|
| 2007/0090911 A1 | 4/2007 | Lee | |
| 2008/0017404 A1 | 1/2008 | Whittaker et al. | |
| 2008/0186124 A1* | 8/2008 | Schaffer | H01F 27/2895 336/200 |
| 2009/0273428 A1* | 11/2009 | Chen | H01F 17/062 336/200 |
| 2011/0193672 A1* | 8/2011 | Yang | H01F 27/2895 216/13 |
| 2012/0154097 A1* | 6/2012 | Dalmia | H01F 17/0033 29/829 |
| 2012/0194314 A1* | 8/2012 | Mo | H05K 1/165 336/200 |
| 2012/0320532 A1 | 12/2012 | Wang | |
| 2014/0132386 A1* | 5/2014 | Kostelnik | H01F 5/00 336/200 |
| 2016/0093431 A1* | 3/2016 | Quilici | H01F 27/2804 336/200 |
| 2016/0111196 A1 | 4/2016 | Francis | |
| 2016/0351322 A1* | 12/2016 | Banba | H01F 17/04 |
| 2017/0025218 A1* | 1/2017 | Sugiyama | H01F 27/245 |
| 2019/0333674 A1* | 10/2019 | Quilici | H05K 3/4611 |
| 2019/0333682 A1* | 10/2019 | Guo | H01F 27/2804 |

FOREIGN PATENT DOCUMENTS

| | | |
|---|---|---|
| CN | 102933040 A | 2/2013 |
| CN | 103327750 A | 9/2013 |
| CN | 103854825 A | 6/2014 |
| CN | 106163128 A | 11/2016 |
| CN | 106332447 A | 1/2017 |
| CN | 106470526 A | 3/2017 |
| CN | 109195327 A | 1/2019 |
| CN | 213277740 U | 5/2021 |
| JP | 2006165212 A | 6/2006 |
| JP | 2006278412 A | 10/2006 |
| JP | 2014138044 A | 7/2014 |

OTHER PUBLICATIONS

Chinese Notification to Grant Patent Right for Invention, Chinese Application No. 202010645958.1, mailed Mar. 24, 2025 (8 pages).
Chinese First Office Action, Chinese Application No. 202010645958.1, mailed Nov. 29, 2024 (15 pages).
European Search Report, European Application No. 20944045.2, mailed Nov. 27, 2023 (127 pages).
European First examination report , European Application No. 20944045.2, mailed Jun. 5, 2024 (10 pages).

* cited by examiner

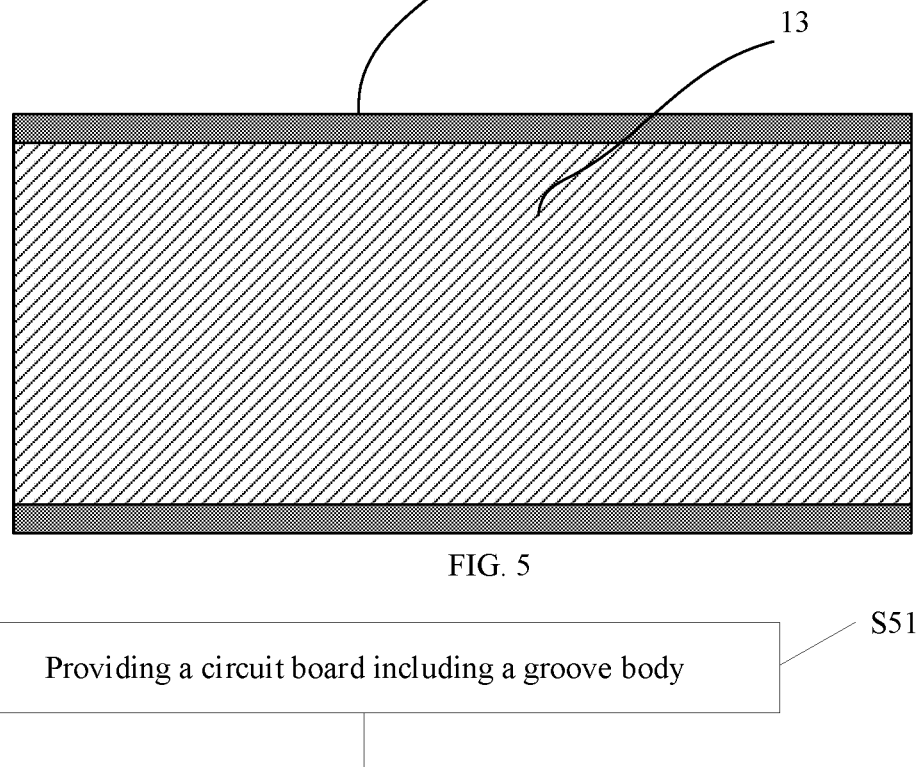

FIG. 5

| | |
|---|---|
| Providing a circuit board including a groove body | S51 |

↓

| | |
|---|---|
| Arranging a winding wire on a magnetic component, the winding wire surrounding the magnetic component along a thickness direction of the magnetic component | S52 |

↓

| | |
|---|---|
| Embedding the magnetic component in the groove body and performing a high-temperature pressing, the winding wire being electrically connected to the circuit board | S53 |

FIG. 6

INDUCTOR ASSEMBLY AND MANUFACTURING METHOD FOR INDUCTOR ASSEMBLY

CROSS REFERENCE TO RELATED APPLICATIONS

The present disclosure is a continuation-application of International (PCT) Patent Application No. PCT/CN2020/127010, filed on Nov. 6, 2020, which claims priority to Chinese Patent Application No. 202010645958.1 filed with China National Intellectual Property Administration on Jul. 7, 2020, the contents of which are herein incorporated by reference in their entireties.

TECHNICAL FIELD

The present disclosure relates to the technical field of inductor embedding, in particular to an inductor assembly and a manufacturing method for an inductor assembly.

BACKGROUND

Hybrid integrated circuits are stepping into a stage of integrating system chips, micro sensors, micro actuators and peripheral film passive components for system packaging. A packaging technology is applied to the system in a unique way, which can reduce the size of the large circuit board connecting many components. The passive components (capacitors, inductors, resistors, etc.) account for 70% to 90% of the number of components in the circuit board and 70% to 80% of the area of the substrate. If the embedded technology of passive components is widely used on the circuit board, the size of a product is expected to be reduced by dozens of times.

Nowadays, the inductors are widely used in a design of the circuit board, and a passive filter circuit formed by the inductors mainly plays the role of signal adjusting and wave filtering. An inductor assembly of a power supply occupies more than 40% of the total area of a surface of the power supply, which is not conducive to the miniaturization design of the product.

SUMMARY

In order to solve the above technical problems, a first technical solution provided in the present disclosure is as following. An inductor assembly is provided and includes a circuit board defining a groove body; a magnetic component embedded in the groove body; and a winding wire, arranged on the magnetic component, surrounding along a thickness direction of the magnetic component, and electrically connected to the circuit board.

In order to solve the above technical problems, a second technical solution provided in the present disclosure is as following. An embedded inductor assembly is provided and includes a circuit plate, a magnetic component and a winding wire. The circuit plate includes a first core plate, a second core plate and a third core plate arranged between the first core plate and the second core plate, and the third core plate defines a groove body extending through the third core plate. The magnetic component is embedded in the groove body. The winding wire is arranged on the magnetic component, surrounds along a thickness direction of the magnetic component, and is electrically connected to the circuit board.

In order to solve the above technical problems, a second technical solution provided in the present disclosure is as following. A manufacturing method for an inductor assembly is provided and includes: providing a circuit board having a groove body; arranging a winding wire on a magnetic component, the winding wire surrounding the magnetic component along a thickness direction of the magnetic component; and embedding the magnetic component in the groove body and performing a high-temperature pressing, the winding wire is electrically connected to the circuit board.

BRIEF DESCRIPTION OF THE DRAWINGS

In order to make the technical solution described in embodiments of the present disclosure more clearly, the drawings used for the description of the embodiments will be described. Apparently, the drawings in the following description are only some embodiments of the present disclosure. For those skilled in the art, other drawings may be acquired according to the drawings without any creative work.

FIG. 5 is a structural schematic view of a magnetic component according to some embodiments of the present disclosure.

FIG. 6 is a flowchart of a manufacturing method of the inductor assembly according to some embodiments of the present disclosure.

DETAILED DESCRIPTION

The technical solutions in the embodiments of the present disclosure are clearly and completely described in conjunction with the drawings in the embodiments of the present disclosure. It is obvious that the described embodiments are only a part of the embodiments of the present disclosure, and not all embodiments. All other embodiments acquired by the ordinary skilled in the art based on the embodiments in the present disclosure without the creative work are all within the scope of the present disclosure.

Figure 1:
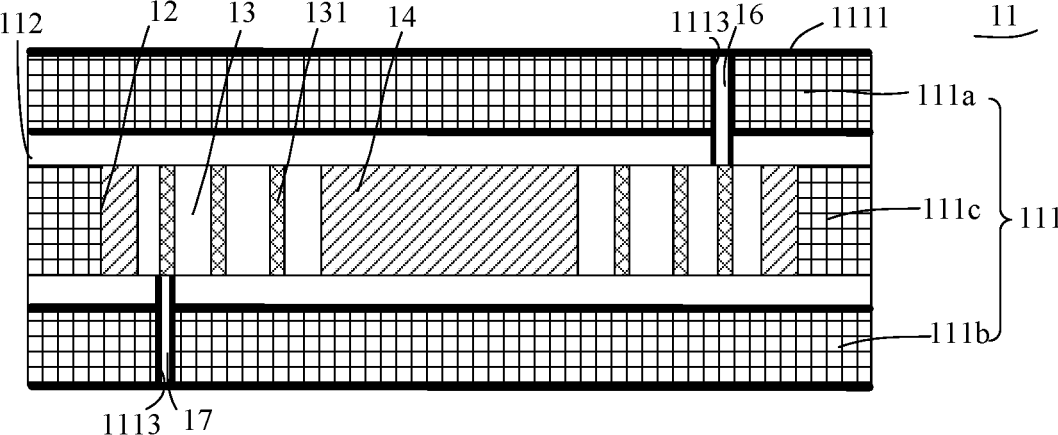
FIG. 1 is a structural schematic view of an inductor assembly according to some embodiments of the present disclosure.

As shown in FIG. 1, IG. 1 is a structural schematic view of an inductor assembly according to some embodiments of the present disclosure. The inductor assembly may include a circuit board 11 and a magnetic component 13. The circuit board 11 may include a groove body 12, and the magnetic component 13 is arranged in the groove body 12. When the magnetic component 13 is arranged in the groove body 12, an axial direction of the magnetic component 13 is substantially perpendicular to a plane at which the circuit board 11 is located. The groove body 12 is arranged on the circuit board without extending through the opposite two surfaces of the circuit board 11, that is, the groove body 12 is defined between the opposite two surfaces of the circuit board 11. In some embodiments, the circuit board 11 may include a core plate 111 and a prepreg 112, the core plate 111 may be a copper-clad plate, which is a basic material for manufacturing the circuit board 11. The copper-clad plate includes a base substrate and a copper foil coated on the base substrate. The base substrate may be manufactured by combining a plurality of the bonding sheets, and each of the bonding sheets is manufactured by dipping materials such as a paper substrate, a glass-fiber-cloth substrate, a synthetic-fiber-cloth substrate, a non-woven fabric substrate, a composite substrate and so on with resin. The manufactured base substrate is coated with a copper foil on one or two opposite surfaces, and then the base substrate is performed with or subjected to a hot-pressed processing and solidified to manufacture the copper-clad plate. In some embodiments, the copper foils on the two surfaces of the core plate 111 may or may not have a pattern layer 1111, which is arranged as required and not limited here. The prepreg 112 is an interlayer bonding layer during a lamination. In some embodiments, the prepreg 112 may include resin and reinforcement materials. When manufacturing multilayer circuit boards, a glass fiber cloth is usually used as a reinforcement material. The glass fiber cloth is dipped with resin glue solution and then pre-baked by a heat treatment to manufacture a thin sheet. The prepreg 112 is softened after being heated and pressurized, is solidified after being cooled, and has a viscosity. In a process of high-temperature pressing, adjacent two layers may be bonded by the prepreg 112. In some embodiments, the circuit board 11 may include three core plates stacked on one another. For example, as shown in FIG. 1, the circuit board 11 may include a first core plate 111a, a second core plate 111b, and a third core plate 111c arranged between the first core plate 111a and the second core plate 111b. The groove body 12 may be defined in the third core plate 111c, and two opposite ends of the groove body 12 terminate at a surface of the first core plate 111a adjacent to the second core plate 111b and at a surface of the second core plate 111b adjacent to the second core plate 111b.

Figure 3:
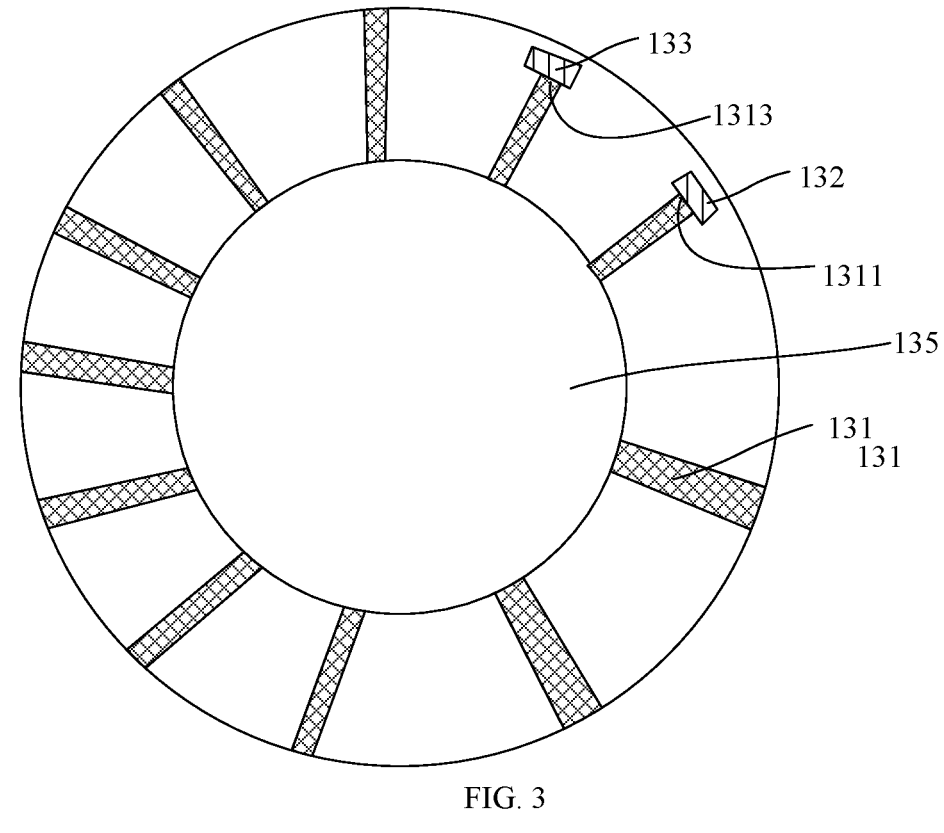
FIG. 3 is a structural schematic view of a magnetic component according to some embodiments of the present disclosure.
Figure 4:
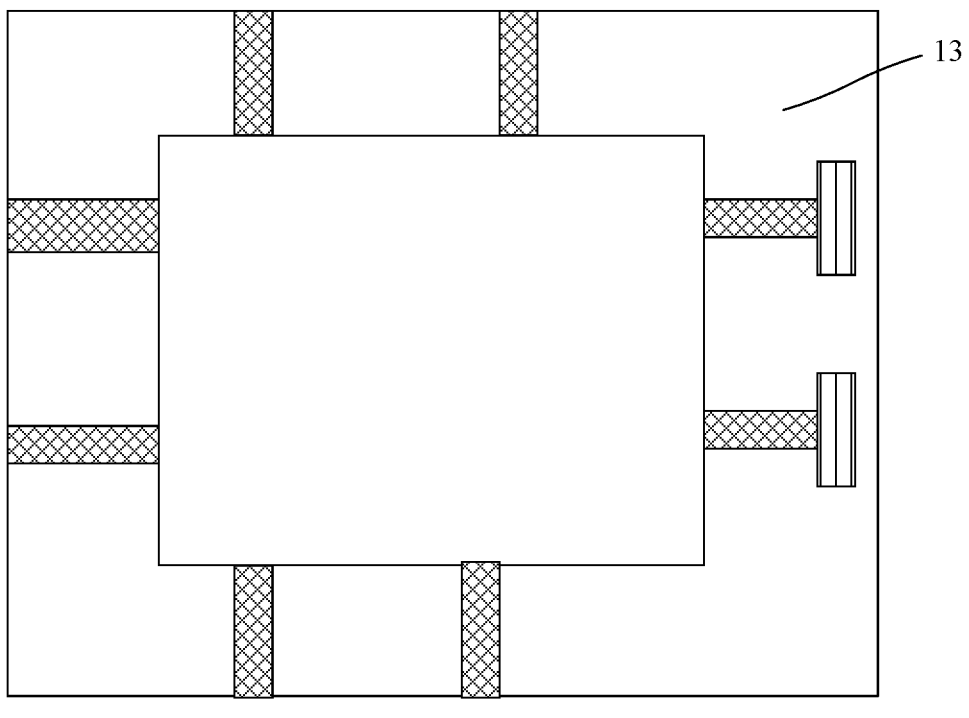
FIG. 4 is a structural schematic view of a magnetic component according to some embodiments of the present disclosure.

The magnetic component 13 may be in a shape of a ring, such as a circular ring as shown in FIG. 3, a square ring as shown in FIG. 4, or other rings in other shapes, which is not limited here. The magnetic component 13 defines an annular part 135 in a middle region of the magnetic component 13. The annular part 135 may be an inner ring of the magnetic component 13.

A winding wire 131 is arranged on the magnetic component 13 and surrounds the magnetic component 13 along a thickness direction of the magnetic component 13. The winding wire 131 is made of copper, is formed by electroplating, and has an input end 1311 and an output end 1313. Each of the input end 1311 and the output end 1313 are connected to a bonding pad. In some embodiments, the number of coils of the winding wire 131 is more than three. In some embodiments, as shown in FIGS. 3 and 4, the input end 1311 of the winding wire 131 is connected to a first bonding pad 132, and the output end 1313 of the winding wire 131 is connected to a second bonding pad 133. The magnetic component 13 is located in the groove body 12, and a first insulating layer 14 is arranged between the magnetic component 13 and the groove body 12. The first insulating layer 14 is filled by the prepreg 112 which melts and flows between the magnetic component 13 and the groove body 12 during a high-temperature pressing. In some embodiments, another first insulating layer 14 may be further arranged in the annular part 135 of the magnetic component 13, as shown in FIG. 1.

The circuit board 11 includes the pattern layer 1111. In some embodiments, the pattern layer 1111 is arranged on a surface of the core plate 111. After the magnetic component 13 is embedded in the groove body 12, the winding wire 131 arranged on the magnetic component 13 needs to be electrically connected to the pattern layer 1111 of the circuit board 11. Therefore, a first blind hole 16 and a second blind hole 17 are defined at positions where the circuit board 11 correspond to the first bonding pad 132 and the second bonding pad 133 respectively.

Figure 2:
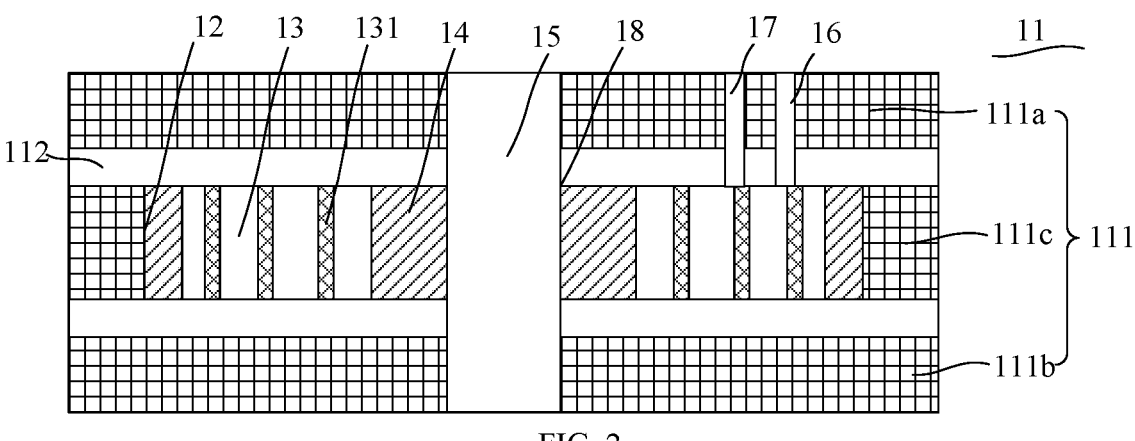
FIG. 2 is a structural schematic view of an inductor assembly according to some embodiments of the present disclosure.

In some embodiments, the first bonding pad 132 and the second bonding pad 133 on the magnetic component 13 may be arranged on a same surface of the magnetic component 13 or on two opposite surfaces of the magnetic component 13. In some embodiments, when the first bonding pad 132 and the second bonding pad 133 are arranged on the same surface of the magnetic component 13 as shown in FIGS. 3 and 4, the first blind hole 16 and the second blind hole 17 may be defined in positions as shown in FIG. 2. When the first bonding pad 132 and the second bonding pad 133 are arranged on the two opposite surfaces of the magnetic component 13 respectively, the first blind hole 16 and the second blind hole 17 may be defined in positions as shown in FIG. 1. As long as the first blind hole 16 and the second blind hole 17 can electrically connect the input end 1311 and output end 1313 of the winding wire 131 to the pattern layer 1111 of the circuit board 11, specific positions of the first blind hole 16 and the second blind hole 17 are not limited here. It can be understood that in order to make the first blind hole 16 and the second blind hole 17 conductive, conductive layers 1113 may be arranged on side walls of the first blind hole 16 and the second blind hole 17.

In some embodiments, as shown in FIG. 5, the surface of the magnetic component 13 may also be covered or coated with a second insulating layer 19. The second insulating layer 19 may be made of polyimide, which can protect the magnetic component 13. The winding wire 131 is arranged on a surface of the second insulating layer 19 by electroplating.

In some embodiments, the magnetic component 13 may be made of manganese-zinc alloy and nickel-zinc alloy, etc. The winding wire 131, the first bonding pad 132, and the second bonding pad 133 may be made of copper.

In the inductor assembly shown in the embodiments, the magnetic component 13 is embedded in the circuit board 11, the winding wire 131 is arranged on the magnetic component 13, and the winding wire 131 is electrically connected to the pattern layer 1111 of the circuit board 11, thereby manufacturing the embedded inductor assembly and realizing a miniaturization of a product.

As shown in FIG. 2, FIG. 2 is a structural schematic view of an inductor assembly according to some embodiments of the present disclosure. Compared with the embodiment shown in FIG. 1, a difference is that the inductor assembly in this embodiment may also include a magnetic core 15. In this embodiment, the magnetic component 13 is substantially annular and defines an annular part 135 in a middle region of the magnetic component 13. The annular part 135 may be an inner ring of the magnetic component 13. The circuit board 11 defines a through hole 18 at a position corresponding to an annular part 135 of the magnetic component 13, the through hole 18 extends through the opposite two surfaces of the circuit board 11 and the first, second, and third core plates, and the magnetic core 15 is inserted into the through hole 18 and flush with the two surfaces of the circuit board 11, respectively. When the magnetic core 15 is inserted into the through hole 18, the magnetic core 15 penetrates the annular part 135 of the magnetic component 13, and the first insulating layer 14 is arranged between the magnetic core 15 and the annular part 135 of the magnetic component 13, the first insulating layer 14 is arranged between the magnetic core 15 and an inner wall of the annular part 135. Same as the embodiment as shown in FIG. 1, the first insulating layer 14 is the prepreg melts and flowing between the annular part 135 of the magnetic component 13 and the magnetic core 15 during a high-temperature pressing.

In some embodiments, the magnetic core 15 is arranged in the middle of the magnetic component 13 to further enhance a magnetic field, thereby improving a performance of the inductor assembly.

As shown in FIG. 6, FIG. 6 is a flowchart of a manufacturing method of the inductor assembly according to some embodiments of the present disclosure. The method may include following operations.

Operation S51 includes: providing a circuit board including a groove body.

The circuit board is manufactured by a core plate and a prepreg. When manufacturing the circuit board, the groove body is arranged at a designated position of the circuit board according to a requirement.

The core plate is the copper-clad plate, which is a basic material for manufacturing the circuit board 11. The copper-clad plate includes a base substrate and a copper foil coated on the base substrate. The base substrate may be manufactured by combining a plurality of the bonding sheets, and each of the bonding sheets is manufactured by dipping materials such as a paper substrate, a glass-fiber-cloth substrate, a synthetic-fiber-cloth substrate, a non-woven fabric substrate, a composite substrate and so on with resin. The manufactured base substrate is coated with a copper foil on one or two opposite surfaces, and then the base substrate is performed with or subjected to a hot-pressed processing and solidified to manufacture the copper-clad plate. In some embodiments, the copper foils on the two surfaces of the core plate may or may not have a pattern layer, which is arranged as required and not limited here. The prepreg is an interlayer bonding layer during a lamination. In some embodiments, the prepreg may include resin and reinforcement materials. When manufacturing multilayer circuit boards, a glass fiber cloth is usually used as a reinforcement material. The glass fiber cloth is dipped with resin glue solution and then pre-baked by a heat treatment to manufacture a thin sheet. The prepreg is softened after being heated and pressurized, is solidified after being cooled, and has a viscosity. In a process of high-temperature pressing, adjacent two layers may be bonded by the prepreg.

Operation S52 includes: arranging a winding wire on a magnetic component. The winding wire surrounds the magnetic component along a thickness direction of the magnetic component.

The magnetic component may be in a shape of a ring such as a circular ring or a square ring, which is not limited here. The winding wire may be arranged on the magnetic component and surrounds the magnetic component. In some embodiments, the metal winding wire surrounding the magnetic component is formed by electroplating around the magnetic component. In some embodiments, the winding wire starts to wind along the thickness direction of the magnetic component.

Operation S53 includes: embedding the magnetic component in the groove body and performing a high-temperature pressing. The winding wire is electrically connected to the circuit board.

The operation of the embedding the magnetic component in the groove body and performing the high-temperature pressing in some embodiments includes: preparing the core plate and the prepreg and defining the groove body in the core plate, placing the magnetic component in the groove body, stacking the core plate and prepreg as required, and performing the high-temperature pressing. In the process of the high-temperature pressing, the prepreg melts and forms a first insulating layer, and then fill a gap between the magnetic component and the groove body.

The manufacturing method for the inductor assembly as shown in this embodiment is to manufacture the embedded inductor assembly, thereby realizing the miniaturization of the product.

Figure 7:
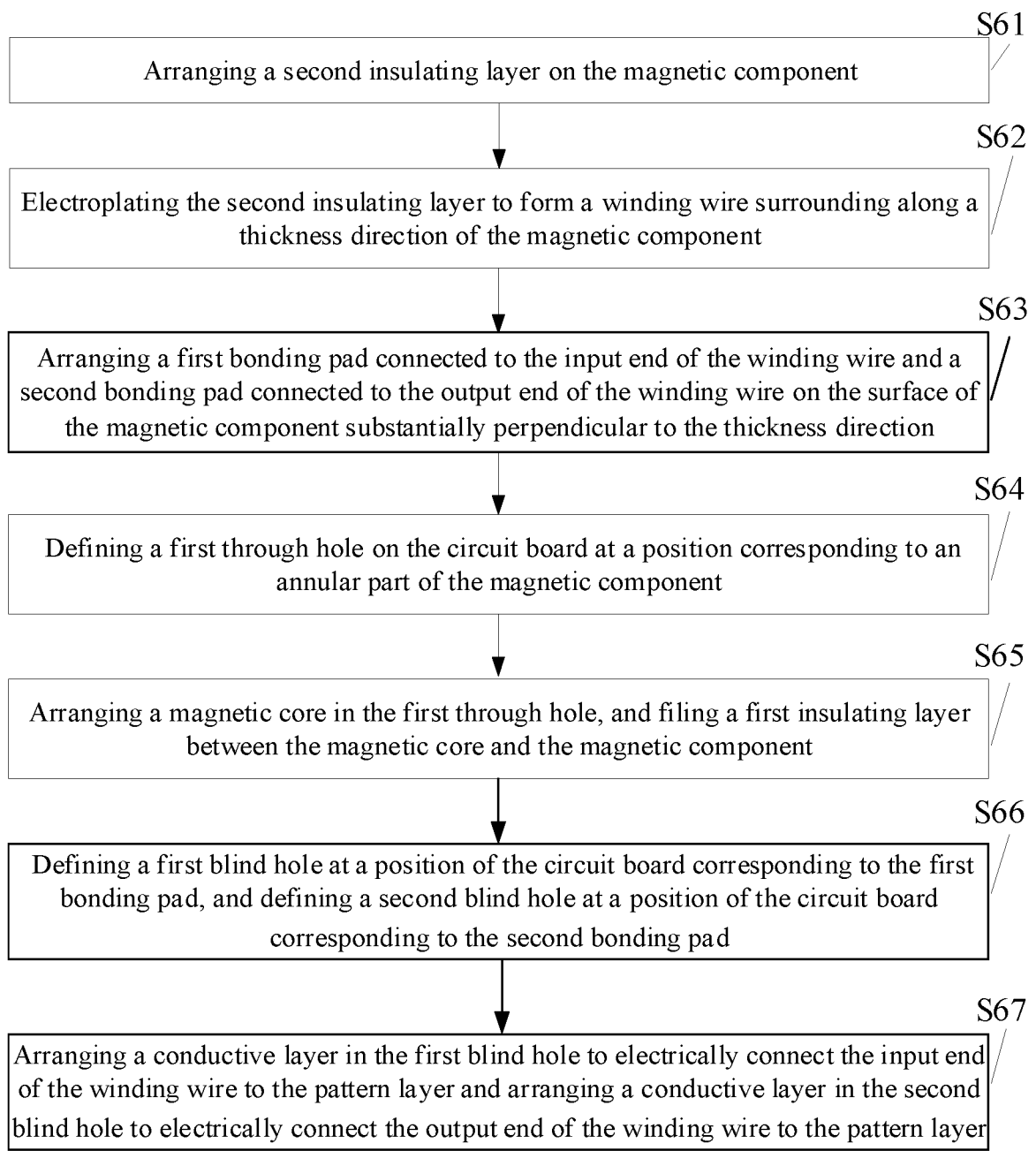
FIG. 7 is a flowchart of a manufacturing method of the inductor assembly according to some embodiments of the present disclosure.

As shown in FIG. 7, FIG. 7 is a flowchart of the manufacturing method of the inductor assembly according to some embodiments of the present disclosure. Compared with the embodiment as shown in FIG. 6, a difference is that this embodiment as shown in FIG. 7 may include following operations.

Operation S61 includes: arranging a second insulating layer on the magnetic component.

The magnetic component is coated with the second insulating layer. In some embodiments, the second insulating layer material is made of polyimide, and the material of magnetic component is one or any combination of a manganese-zinc alloy and a nickel-zinc alloy.

Operation S62 includes: electroplating the second insulating layer to form a winding wire surrounding along a thickness direction of the magnetic component.

The surface of the second insulating layer is electroplated to form the winding wire surrounding the magnetic component. In some embodiments, the winding wire includes an input end and an output end, and the winding wire surrounds the magnetic component along the thickness direction of the magnetic component. In some embodiments, the number of coils of the winding wire 131 is more than three.

Operation S63 includes: arranging a first bonding pad connected to the input end of the winding and a second bonding pad connected to the output end of the winding wire on the surface of the magnetic component substantially perpendicular to the thickness direction.

The first bonding pad connected to the input end and the second bonding pad connected to the output end are arranged at positions where the input end and the output end of the magnetic component are located. In some embodiments, the first bonding pad and the second bonding pad may be manufactured simultaneously in the process of manufacturing the winding wire by electroplating.

Operation S64 includes: defining a through hole on the circuit board at a position corresponding to an annular part of the magnetic component.

In some embodiments, after the magnetic component is embedded in the circuit board, the through hole extending through the circuit board is arranged on the circuit board at a position corresponding to the annular part of the magnetic component. A diameter of the through hole is smaller than a diameter of the annular part of the magnetic component.

Operation S65 includes: arranging a magnetic core in the through hole and filling first insulating layer between the magnetic core and the magnetic component.

The magnetic core is arranged in the through hole. In some embodiments, after the magnetic core is arranged in the through hole, in order to ensure that the magnetic core is adhered to the circuit board, the circuit board is performed with or subjected to the high-temperature pressing. At this time, the prepreg melts and fills a gap between the magnetic core and the magnetic component to form the first insulating layer.

Operation S66 includes: defining a first blind hole at a position of the circuit board corresponding to the first bonding pad, and defining a second blind hole at a position of the circuit board corresponding to the second bonding pad.

In some embodiments, after the magnetic core is arranged, the first blind hole is defined at the position of the circuit board corresponding to the first bonding pad, and the second blind hole is defined at the position of the circuit board corresponding to the second bonding pad. The first blind hole and the second blind hole are configured to electrically connect the pattern layer arranged on the circuit board to the input end and the output end of the winding wire. In some embodiments, the positions of the first blind hole and the second blind hole may be determined according to the positions of the first bonding pad and the second bonding pad. The first blind hole and the second blind hole may be arranged on a same side of the circuit board or opposite two sides of the circuit board, which is not limited here.

Operation S67 includes: arranging a conductive layer in the first blind hole to electrically connect the input end of the winding wire to the pattern layer and arranging a conductive layer in the second blind hole to electrically connect the output end of the winding wire to the pattern layer.

In order to enable the first blind hole and the second blind hole to have a conductivity, after the first blind hole and the second blind hole are manufactured, the conductive layers are arranged on side walls of the first blind hole and the second blind hole.

An inductor assembly is provided and includes a circuit board defining a groove body; a magnetic component embedded in the groove body; and a winding wire, arranged on the magnetic component, surrounding along a thickness direction of the magnetic component, and electrically connected to the circuit board.

In some embodiments, the inductor assembly further includes a magnetic core. The magnetic component is substantially in shape of a ring, an axial direction of the magnetic core is substantially perpendicular to a plane direction where the circuit board is located, the circuit board defines a through hole corresponding to an annular part of the magnetic component, the magnetic core is inserted into the through hole and is flush with two opposite surfaces of the circuit board. First insulating layers are filled between the magnetic core and the magnetic component, and between the magnetic component and the groove body.

In some embodiments, a first bonding pad and a second bonding pad are arranged on a surface of the magnetic component substantially perpendicular to the thickness direction of the circuit board, the first bonding pad is electrically connected to an input end of the winding wire, and the second bonding pad is electrically connected to an output end of the winding wire.

In some embodiments, a first blind hole is defined at position of the circuit board corresponding to the first bonding pad, and a second blind hole is defined at a position of the circuit board corresponding to the second bonding pad. A pattern layer is arranged on the circuit board, and conductive layers are arranged on side walls of the first blind hole and the second blind hole. The first bonding pad is electrically connected to the pattern layer through the second blind hole to electrically connect the input end of the winding wire to the pattern layer. The second bonding pad is electrically connected to the pattern layer through the second blind hole to electrically connect the output end of the winding wire to the pattern layer.

In some embodiments, the first bonding pad and the second bonding pad are located on a same surface of the magnetic component. Or the first bonding pad and the second bonding pad are located on opposite two surfaces of the magnetic component, respectively.

In some embodiments, the through hole extends through the circuit board.

In some embodiments, a diameter of the through hole is less a diameter of the annular part of the magnetic component.

In some embodiments, the magnetic component is in a shape of a ring, and defines an annular part in a middle region of the magnetic component. A first insulating layer is arranged in the annular part and arranged between the magnetic component and the groove body.

In some embodiments, the groove body is defined between the opposite two surfaces of the circuit board.

In some embodiments, a second insulating layer is coated on the magnetic component, the winding wire is located on a surface of the second insulating layer, and the winding wire is made of copper.

An embedded inductor assembly is provided and includes a circuit board, a magnetic component and a winding wire. The circuit board includes a first core plate, a second core plate and a third core plate arranged between the first core plate and the second core plate, and the third core plate defines a groove body extending through the third core plate. The magnetic component is embedded in the groove body. The winding wire is arranged on the magnetic component, surrounds along a thickness direction of the magnetic component, and is electrically connected to the circuit board.

In some embodiments, the inductor assembly further includes a magnetic core. The magnetic component is substantially in shape of a ring, an axial direction of the magnetic core is substantially perpendicular to a plane direction where the circuit board is located, the circuit board defines a through hole corresponding to an annular part of the magnetic component, the through hole extends through the first, second, and third core plates, the magnetic core is inserted into the through hole and is flush with two opposite surfaces of the circuit board. First insulating layers are filled between the magnetic core and the magnetic component, and between the magnetic component and the groove body.

In some embodiments, a first bonding pad and a second bonding pad are arranged on a surface of the magnetic component substantially perpendicular to the thickness direction of the circuit board, the first bonding pad is electrically connected to an input end of the winding wire, and the second bonding pad is electrically connected to an output end of the winding wire.

In some embodiments, a first blind hole is defined at position of the circuit board corresponding to the first bonding pad, and a second blind hole is defined at a position of the circuit board corresponding to the second bonding pad. A pattern layer is arranged on the circuit board, and conductive layers are arranged on side walls of the first blind hole and the second blind hole. The first bonding pad is electrically connected to the pattern layer through the second blind hole to electrically connect the input end of the winding wire to the pattern layer. The second bonding pad is electrically connected to the pattern layer through the second blind hole to electrically connect the output end of the winding wire to the pattern layer.

In some embodiments, the first bonding pad and the second bonding pad are located on a same surface of the magnetic component. Or the first bonding pad and the second bonding pad are located on opposite two surfaces of the magnetic component, respectively.

In some embodiments, the groove body is defined between the opposite two surfaces of the circuit board.

In some embodiments, a second insulating layer is coated on the magnetic component, the winding wire is located on a surface of the second insulating layer, and the winding wire is made of copper.

A manufacturing method for an inductor assembly is provided and includes: providing a circuit board having a groove body; arranging a winding wire on a magnetic component, the winding wire surrounding the magnetic component along a thickness direction of the magnetic component; and embedding the magnetic component in the groove body and performing a high-temperature pressing, the winding wire is electrically connected to the circuit board.

In some embodiments, the embedding the magnetic component in the groove body and performing a high-temperature pressing, includes: defining a through hole on the circuit board at a position corresponding to an annular part of the magnetic component; and arranging a magnetic core in the through hole and filling a first insulating layer between the magnetic core and the magnetic component; the magnetic component is substantially in shape of a ring; the arranging a winding wire on a magnetic component, includes: arranging a second insulating layer on the magnetic component; electroplating the second insulating layer to form the winding wire surrounding along the thickness direction of the magnetic component; and arranging a first bonding pad connecting to an input end of the winding wire and a second bonding pad connecting to an output end of the winding wire on a surface of the magnetic component substantially perpendicular to the thickness direction.

In some embodiments, the circuit board includes a pattern layer; after the embedding the magnetic component in the groove body and performing a high-temperature pressing, the manufacturing method further includes: defining a first blind hole on the circuit board at a position corresponding to the first bonding pad, and defining a second blind hole at the position of the circuit board corresponding to the second bonding pad; and arranging a conductive layer in the first blind hole to connect the input end of the winding wire to the pattern layer and arranging a conductive layer in the second blind hole to electrically connect the output end of the winding wire to the pattern layer.

The inductor assembly and the manufacturing method for the inductor assembly provided in some embodiments of the present disclosure realize the manufacturing of the embedded inductor assembly and the miniaturization of the product by defining the groove body in the circuit board, embedding the magnetic component in the groove body, and arranging the winding wires on the magnetic component.

Above embodiments are only some embodiments of the present disclosure, and can not be understood as limitation of scope of the present disclosure. Any equivalent structure or equivalent process transformation made by using the description of the present disclosure and the drawings, or contents of the present disclosure directly or indirectly applied in other related technical fields, are equally included in the scope of the present disclosure.

What is claimed is:

1. An inductor assembly, comprising:
a circuit board, defining a groove body;

a magnetic component, embedded in the groove body; and
a winding wire, arranged on the magnetic component, surrounding along a thickness direction of the magnetic component, and electrically connected to the circuit board; a magnetic core; wherein the magnetic component is substantially in shape of a ring, an axial direction of the magnetic core is substantially perpendicular to a plane direction where the circuit board is located, the circuit board defines a through hole corresponding to an annular part of the magnetic component, the magnetic core is inserted into the through hole and is flush with two opposite surfaces of the circuit board; and wherein first insulating layers are filled between the magnetic core and the magnetic component, and between the magnetic component and the groove body.

2. The inductor assembly according to claim 1, wherein a first bonding pad and a second bonding pad are arranged on a surface of the magnetic component substantially perpendicular to the thickness direction of the circuit board, the first bonding pad is electrically connected to an input end of the winding wire, and the second bonding pad is electrically connected to an output end of the winding wire.

3. The inductor assembly according to claim 2, wherein a first blind hole is defined at position of the circuit board corresponding to the first bonding pad, and a second blind hole is defined at a position of the circuit board corresponding to the second bonding pad;
a pattern layer is arranged on the circuit board, and conductive layers are arranged on side walls of the first blind hole and the second blind hole;
the first bonding pad is electrically connected to the pattern layer through the second blind hole to electrically connect the input end of the winding wire to the pattern layer; and
the second bonding pad is electrically connected to the pattern layer through the second blind hole to electrically connect the output end of the winding wire to the pattern layer.

4. The inductor assembly according to claim 3, wherein the first bonding pad and the second bonding pad are located on a same surface of the magnetic component; or
the first bonding pad and the second bonding pad are located on opposite two surfaces of the magnetic component, respectively.

5. The inductor assembly according to claim 1, wherein the through hole extends through the circuit board.

6. The inductor assembly according to claim 1, wherein a diameter of the through hole is less than a diameter of the annular part of the magnetic component.

7. The inductor assembly according to claim 1, wherein the magnetic component is in a shape of a ring and defines an annular part in a middle region of the magnetic component;
first insulating layers are arranged in the annular part and arranged between the magnetic component and the groove body.

8. The inductor assembly according to claim 1, wherein the groove body is arranged between the opposite two surfaces of the circuit board.

9. The inductor assembly according to claim 1, wherein a second insulating layer is coated on the magnetic component, the winding wire is located on a surface of the second insulating layer, and the winding wire is made of copper.

10. An embedded inductor assembly, comprising:
a circuit board, comprising a first core plate, a second core plate, and a third core plate arranged between the first core plate and the second core plate, and the third core plate defining a groove body extending through the third core plate;

a magnetic component, embedded in the groove body; and a winding wire, arranged on the magnetic component, surrounding along a thickness direction of the magnetic component, and electrically connected to the circuit board; a magnetic core; wherein the magnetic component is substantially in shape of a ring, an axial direction of the magnetic core is substantially perpendicular to a plane direction where the circuit board is located, the circuit board defines a through hole corresponding to an annular part of the magnetic component, the through hole extends through the first, second, and third core plates, the magnetic core is inserted into the through hole and is flush with two opposite surfaces of the circuit board; and wherein first insulating layers are filled between the magnetic core and the magnetic component, and between the magnetic component and the groove body.

11. The embedded inductor assembly according to claim 10, wherein a first bonding pad and a second bonding pad are arranged on a surface of the magnetic component substantially perpendicular to the thickness direction of the circuit board, the first bonding pad is electrically connected to an input end of the winding wire, and the second bonding pad is electrically connected to an output end of the winding wire.

12. The embedded inductor assembly according to claim 11, wherein a first blind hole is defined at position of the circuit board corresponding to the first bonding pad, and a second blind hole is defined at a position of the circuit board corresponding to the second bonding pad;

a pattern layer is arranged on the circuit board, and conductive layers are arranged on side walls of the first blind hole and the second blind hole;

the first bonding pad is electrically connected to the pattern layer through the second blind hole to electrically connect the input end of the winding wire to the pattern layer; and the second bonding pad is electrically connected to the pattern layer through the second blind hole to electrically connect the output end of the winding wire to the pattern layer.

13. The embedded inductor assembly according to claim 12, wherein the first bonding pad and the second bonding pad are located on a same surface of the magnetic component; or the first bonding pad and the second bonding pad are located on opposite two surfaces of the magnetic component, respectively.

14. The embedded inductor assembly according to claim 10, wherein the groove body is defined between the opposite two surfaces of the circuit board.

15. The embedded inductor assembly according to claim 10, wherein a second insulating layer is coated on the magnetic component, the winding wire is located on a surface of the second insulating layer, and the winding wire is made of copper.

* * * * *